United States Patent
Kim

(10) Patent No.: US 7,078,938 B2
(45) Date of Patent: Jul. 18, 2006

(54) METHOD OF DETECTING PHASE DIFFERENCE, PHASE DETECTOR FOR PERFORMING THE SAME AND CLOCK-AND-DATA RECOVERING DEVICE INCLUDING THE PHASE DETECTOR

(75) Inventor: Nyun-Tae Kim, Yongin (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 37 days.

(21) Appl. No.: 10/850,162

(22) Filed: May 21, 2004

(65) Prior Publication Data

US 2005/0017758 A1 Jan. 27, 2005

(30) Foreign Application Priority Data

Jul. 26, 2003 (KR) .......................... 10-2003-51716

(51) Int. Cl.
*G01R 29/00* (2006.01)
(52) U.S. Cl. .................. 327/2; 327/3; 327/12; 327/156
(58) Field of Classification Search .................... 327/2, 327/3, 7–8, 12, 156, 147
See application file for complete search history.

(56) References Cited

U.S. PATENT DOCUMENTS

| | | | | |
|---|---|---|---|---|
| 5,640,523 A | * | 6/1997 | Williams | 375/360 |
| 6,259,278 B1 | * | 7/2001 | Huang | 327/12 |
| 6,496,046 B1 | * | 12/2002 | Johnson | 327/157 |
| 6,686,777 B1 | * | 2/2004 | Karlquist | 327/2 |

* cited by examiner

*Primary Examiner*—Dinh T. Le
(74) *Attorney, Agent, or Firm*—Harness, Dickey & Pierce, P.L.C.

(57) ABSTRACT

First and fourth phase difference signals, and first and second phase difference information signals respectively having first, fourth, second and third phase differences may be generated using an input signal and a plurality of clock signals each of which has different phase with each other. A level of the first phase difference information signal may be lowered, and a second phase difference signal having a first level less than levels of the first and fourth phase difference signals may be generated. A level of the second phase difference information signal may be lowered, and a third phase difference signal having a second level less than the levels of the first and fourth phase difference signals may be generated. The level of the phase difference signals having a phase difference lower than 45° may be lowered, and thus the operational speed of a CDR device may be maintained and/or the jitter characteristics may be enhanced.

51 Claims, 14 Drawing Sheets

1ST, 4TH PHASE DIFFERENCE SIGNAL

2ND, 3RD PHASE DIFFERENCE SIGNAL

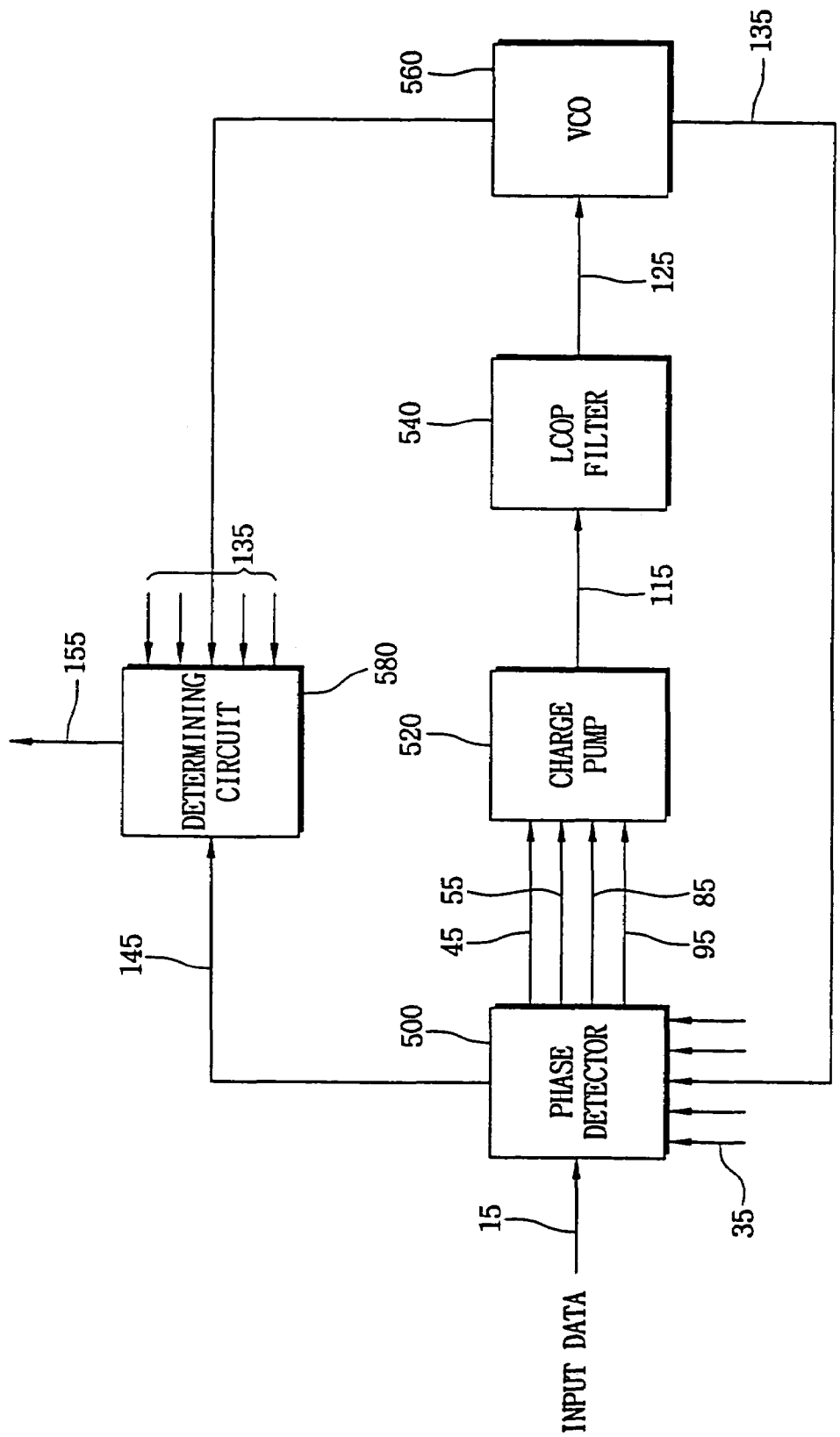

METHOD OF DETECTING PHASE DIFFERENCE, PHASE DETECTOR FOR PERFORMING THE SAME AND CLOCK-AND-DATA RECOVERING DEVICE INCLUDING THE PHASE DETECTOR

CROSS-REFERENCE TO RELATED APPLICATIONS

This application claims priority upon Korean Patent Application No. 2003-51716 filed on Jul. 26, 2003, the contents of which are herein incorporated by reference in its entirety.

BACKGROUND OF THE INVENTION

1. Field of the Invention

The present invention relates to a method of detecting a phase difference, a phase detector for performing the same and a clock and data recovering (CDR) device including the phase detector. More particularly, the present invention relates to a method of detecting a phase difference for reducing jitter while maintaining the operation speed, a phase detector for performing the same and a clock and data recovering device including the phase detector.

2. Description of the Related Art

A bang-bang phase detector is a conventional phase detector for high-speed interface applications. A conventional bang-bang phase detector detects a phase difference between input signals and outputs a phase difference signal having a constant voltage level, regardless of the value of the phase difference.

Therefore, the conventional bang-bang phase detector may detect the phase difference between input signals in a high-speed. In particular, when the phase difference signal has a phase difference lower than 45°, the conventional bang-bang phase detector outputs a phase difference signal having a voltage level that is the same as the voltage level of the phase difference signal having a phase difference higher than 45°. Therefore, when the conventional bang-bang phase detector is used in a clock and data recovery (CDR) circuit, the conventional bang-bang phase detector outputs a phase difference signal having unnecessarily a high voltage level when the phase difference signal has a phase difference lower than 45°, and a pull-in time (or lock time) in a charge pump of the clock and data recovery (CDR) increases, and a jitter characteristic measured in the clock and data recovery (CDR) device using the phase detector may be deteriorated.

SUMMARY OF THE INVENTION

In an exemplary embodiment, the present invention provides a phase detector that detects the phase difference between input signals at the same or substantially the same speed as that of the conventional phase detector and the jitter measured in a clock and data recovery (CDR) device using the phase detector according to exemplary embodiments of the present invention is reduced, or that detects the phase difference between input signals at high-speed without substantially deteriorating the jitter measured in the CDR device using the phase detector according to exemplary embodiments of the present invention.

In an exemplary embodiment, the present invention provides a method of detecting a phase difference using the phase detector according to exemplary embodiments of the present invention.

In an exemplary embodiment, the present invention provides a clock and data recovery (CDR) device using the phase detector according to exemplary embodiments of the present invention.

In an exemplary embodiment, the present invention provides a method of detecting a phase difference. First and fourth phase difference signals having a first phase difference and a fourth phase difference, respectively, and first and second phase difference information signals having a second phase difference and a third phase difference, respectively, are generated using an input signal and a plurality of clock signals, each of which has different phase. A level of the first phase difference information signal is lowered, and a second phase difference signal having a level less than levels of the first and fourth phase difference signals is generated. A level of the second phase difference information signal is lowered, and a third phase difference signal having a level less than the levels of the first and fourth phase difference signals is generated. The clock signals may include a reference clock signal that is a reference signal for determining the first, second, third and fourth phase differences. The first, second, third and fourth phase differences may be phase differences between the center of the input signal and the rising edge of the reference clock signal. The first and fourth phase differences may be in a range from about 45° to about 90°, and the second and third phase differences respectively may be in a range from about 0° to about 45°.

In another exemplary embodiment, the present invention provides a method of detecting a phase difference. First and fourth phase difference signals having a first phase difference and a fourth phase difference, respectively, and first and second phase difference information signals having a second phase difference and a third phase difference, respectively, are generated using an input signal and a plurality of clock signals, each of which has a phase difference of n×45° with respect to a reference clock signal (where n is a natural number). The first phase difference information signal is integrated, and a second phase difference signal having a level less than levels of the first and fourth phase difference signals is generated. The second phase difference information signal is integrated, and a third phase difference signal having a level less than the levels of the first and fourth phase difference signals is generated.

In another exemplary embodiment, the present invention provides a phase detector including a phase difference signal generating section and a level control section. The phase difference signal generating section generates a first phase difference signal having a first phase difference, a fourth phase difference signal having a fourth phase difference, a first phase difference information signal having a second phase difference, and a second phase difference information signal having a third phase difference using an input signal and a plurality of clock signals each of which has different phase. The level control section is coupled to the phase difference signal generating section, receives the first and second phase difference information signals from the phase difference signal generating section, lowers a level of the first phase difference information signal to generate a second phase difference signal having a level less than levels of the first and fourth phase difference signals, and lowers a level of the second phase difference information signal to generate a third phase difference signal having a level less than the levels of the first and fourth phase difference signals.

The clock signals may include a first clock signal that is the same as the reference clock signal, a second clock signal having a phase difference of about 45° with respect to the first clock signal, a third clock signal having a phase difference of about 90° with respect to the first clock signal, a fourth clock signal having a phase difference of about 135° with respect to the first clock signal, and a fifth clock signal having a phase difference of about 180° with respect to the first clock signal.

The phase difference signal generating section may include an input section and a logic section. The input section receives the input signal and the clock signals to generate a plurality of phase signals using the input signal and the clock signals. The logic section is coupled to the input section, and receives the phase signals and one of the clocks signals to generate the first and fourth phase difference signals, and the first and second phase difference information signals.

The input section may include a first D type flip flop for receiving the input signal to generate a first phase signal in response to the first clock signal, a second D type flip flop for receiving the input signal to generate a second phase signal in response to the second clock signal, a third D type flip flop for receiving the input signal to generate a third phase signal in response to the third clock signal, a fourth D type flip flop for receiving the input signal to generate a fourth phase signal in response to the fourth clock signal, and a fifth D type flip flop for receiving the input signal to generate a fifth phase signal in response to the fifth clock signal.

The logic section may include a phase difference signal generator and a synchronizer. The phase difference signal generator receives the phase signals and a synchronization signal to generate the first and fourth phase difference signals, and the first and second phase difference information signals using the phase signals and the synchronization signal. The synchronizer generates the synchronization signal using one of the clock signals, the first and fourth phase difference signals, and the first and second phase difference information signals being synchronized with the synchronization signal. The first phase difference signal generator may include a first inverter coupled to the first D type flip flop, a fourth inverter coupled to the fourth D type flip flop, a first AND gate coupled to the first inverter, and a fourth AND gate coupled to the fourth inverter. The phase difference information signal generator may include a second inverter coupled to the second D type flip flop, a third inverter coupled to the third D type flip flop, a second AND gate coupled to the second inverter, and a third AND gate coupled to the third inverter. The level control section may include first and second level control section. The first level control section lowers the level of the first phase difference information signal to generate the second phase difference signal having a level less than the levels of the first and fourth phase difference signals. The second level control section lowers the level of the second phase difference information signal to generate the third phase difference signal having a level less than the levels of the first and fourth phase difference signals.

The first level control section may include a first resistive element coupled to the second AND gate, and a first capacitive element coupled to the first resistive element. The second level control section may include a second resistive element coupled to the third AND gate, and a second capacitive element coupled to the second resistive element.

In another exemplary embodiment, the present invention provides a phase detector including a phase difference signal generating section and an integrator. The phase difference signal generating section generates a first phase difference signal having a first phase difference, a fourth phase difference signal having a fourth phase difference, a first phase difference information signal having a second phase difference, and a second phase difference information signal having a third phase difference using an input signal and a plurality of clock signals each of which has a phase difference of n×45° with respect to a reference clock signal (where n is a natural number). The integrator is coupled to the phase difference signal generating section, receives the first and second phase difference information signals from the phase difference signal generating section, generates a second phase difference signal having a level less than levels of the first and fourth phase difference signals, and generates a third phase difference signal having a level less than the levels of the first and fourth phase difference signals. The integrator may include a first resistive element coupled to the phase difference signal generating section, a capacitive element coupled to the first resistive element, and a second resistive element coupled to the phase difference signal generating section and the capacitive element.

In another exemplary embodiment, the present invention provides a clock and data recovering device including one or more of the above-described phase detectors, a charge pump, a loop filter, a voltage controlled oscillator and a determining circuit. The charge pump generates a charge control signal using the first, second, third and fourth phase difference signals. The loop filter is charging and discharged in response to the charge control signal to generate a voltage control signal. The voltage controlled oscillator receives the voltage control signal and compensates the frequencies of the clock signals using the voltage control signal to output the compensated clock signals. The determining circuit re-times the first data signal using the compensated clock signals to generate a re-timed second data signal.

According to exemplary embodiments of the present invention, the phase detector lowers the level of the phase difference signal having a phase difference lower than 45°, and thus the operational speed of the CDR device may be maintained to have the same level of that of the CDR device using the conventional phase detector and the jitter characteristics may be enhanced.

In addition, the phase detector maintains the level of the phase difference signal having a phase difference lower than 45° as a low level and maintains the level of the phase difference signal having a phase difference higher than 45° as a high level, and thus the operational speed of the CDR device may be enhanced and the jitter characteristics may not be deteriorated compared with the CDR device using the conventional phase detector.

In another exemplary embodiment, the present invention provides a clock and data recovering device including a charge pump configured to generate a charge control signal using first, second, third and fourth phase difference signals, a loop filter being charged and discharged in response to the charge control signal to generate a voltage control signal, a voltage controlled oscillator configured to receive the voltage control signal, for compensating the frequencies of the clock signals using the voltage control signal to output compensated clock signals, and a determining circuit configured to re-time the first data signal using the compensated clock signals to generate a re-timed second data signal.

In another exemplary embodiment, the present invention provides a method of detecting a phase difference, the method including generating a plurality of phase difference signals having a corresponding plurality of phase differences from an input signal and a plurality of clock signals, each of which has a different phase and lowering or proportionally varying a level of one or more of the plurality of phase difference signals depending on a value of the corresponding phase difference.

In another exemplary embodiment, the present invention provides a phase detector including a phase difference signal generating section configured to generate a plurality of phase difference signals having a corresponding plurality of phase differences from an input signal and a plurality of clock signals, each of which has a different phase and a level control section configured to lower a level of one or more of the plurality of phase difference signals depending on a value of the corresponding phase difference.

In another exemplary embodiment, the present invention provides a phase detector including a level control section, the level control section including a plurality of level control sections, each receiving a phase difference signal of a plurality of phase difference signals, the plurality of phase difference signals each having a corresponding phase differences, the plurality of phase difference signals being generated from an input signal and a plurality of clock signals, each of which has a different phase and each of the plurality of level control sections lowering a level of the corresponding phase difference signal depending on a value of the corresponding phase difference.

BRIEF DESCRIPTION OF THE DRAWINGS

Exemplary embodiments of the present invention will become more apparent by describing in detail exemplary embodiments thereof with reference to the accompanying drawings, in which:

FIG. 9 is a block diagram showing a clock and data recovery (CDR) device according to an exemplary embodiment of the present invention;

DESCRIPTION OF EXEMPLARY EMBODIMENTS

Hereinafter the exemplary embodiments of the present invention will be described in detail with reference to the accompanying drawings.

Figure 1:
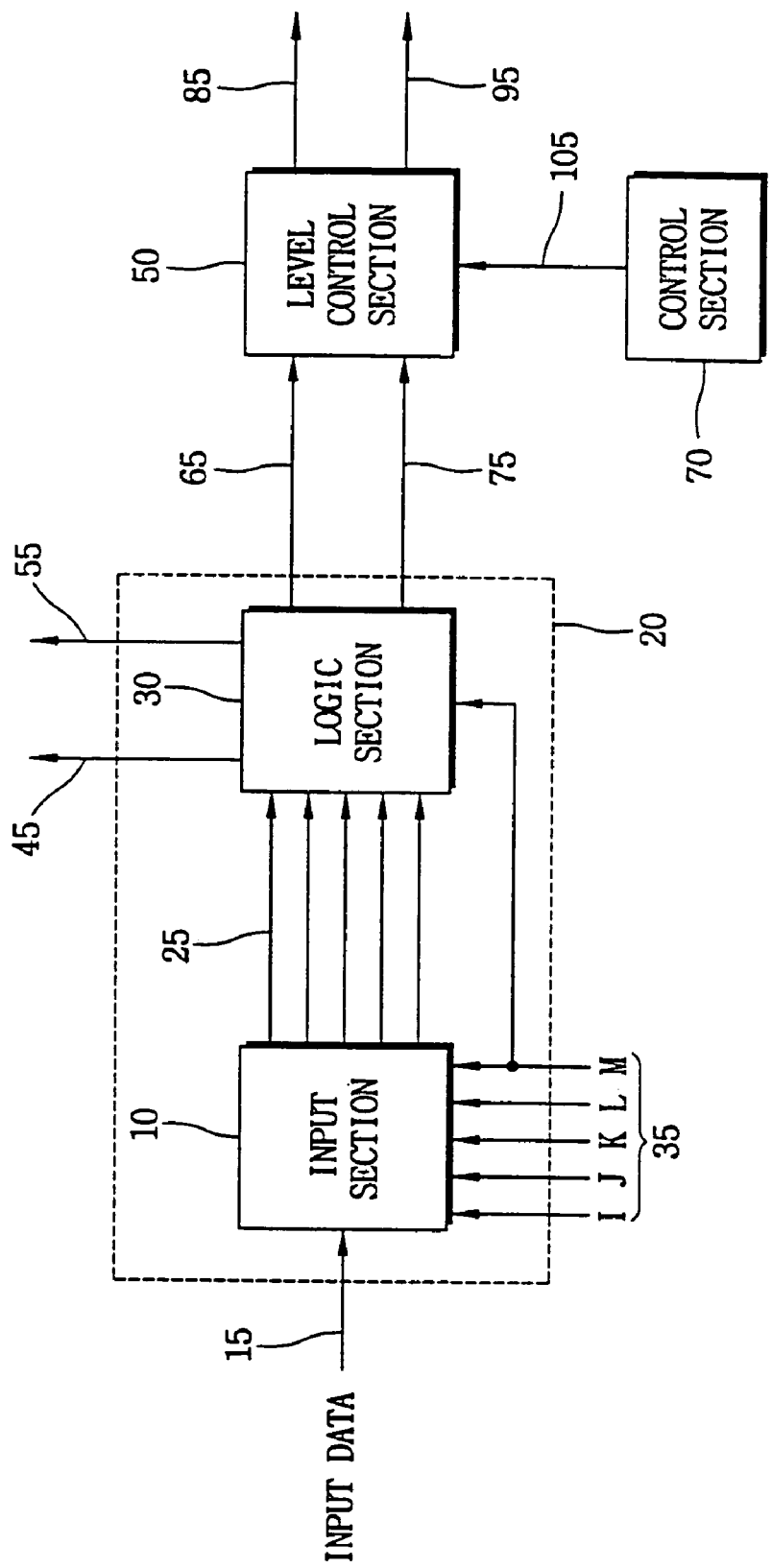
FIG. 1 is a block diagram showing a phase detector according to an exemplary embodiment of the present invention.

FIG. 1 is a block diagram showing a phase detector according to an exemplary embodiment of the present invention.

Referring to FIG. 1, the phase detector according to an exemplary embodiment of the present invention includes a phase difference signal generating section 20 and a level control section 50. A phase difference signal generating section according to another exemplary embodiment of the present invention may further include a control section 70.

The phase difference signal generating section 20 includes an input section 10 and a logic section 30. In an exemplary embodiment, the phase detector may be a bang-bang phase detector.

The phase difference signal generating section 20 generates a first phase difference signal 45 having a first phase difference, a fourth phase difference signal 55 having a fourth phase difference, a first phase difference information signal 65 having a second phase difference, and a second phase difference information signal 75 having a third phase difference using an input data signal 15 and a plurality of clock signals 35. The first and fourth phase differences are phase differences between a reference clock signal and the input data signal and are larger phase differences, for example in a range from about 45° to about 90°. The first phase difference signal 45 may correspond to a phase difference signal when the input data signal 15 has a leading phase with respect to the reference clock signal. The fourth phase difference signal 55 may correspond to a phase difference signal when the reference clock signal has a leading phase with respect to the input data signal 15.

The second and third phase differences are phase differences between the reference clock signal and the input data signal 15 and are a smaller phase differences, for example in a range from about 0° to about 45°. The first phase difference information signal 65 may correspond to a phase difference signal when the input data signal 15 has a leading phase with respect to the reference clock signal. The second phase difference information signal 75 may correspond to a phase difference signal when the reference clock signal has a leading phase with respect to the input data signal 15. The reference clock signal is a reference signal for determining the first, second, third and fourth phase differences. The first, second, third and fourth phase differences are phase differences between the center of the input data signal and the rising edge of the reference clock signal.

The input section 10 receives the input signal and the clock signals to generate a plurality of phase signals 25 using the input signal and the clock signals. Each of the clock signals 35 may have a different phase from each other. Each of the clock signals may have a phase difference of n (n is a natural number)×45° with respect to the reference clock signal. In an exemplary embodiment, the clocks signals 35 include a first clock signal (hereinafter, referred to as the I clock signal) that is the same as the reference clock signal, a second clock signal (hereinafter the J clock signal) having a phase difference of about 45° with respect to the I clock signal, a third clock signal (hereinafter, referred to as the K clock signal) having a phase difference of about 90° with respect to the I clock signal, a fourth clock signal (hereinafter, referred to as the L clock signal) having a phase difference of about 135° with respect to the I clock signal, and a fifth clock signal (hereinafter, referred to as the M clock signal) having a phase difference of about 180° with respect to the I clock signal. Hereinafter, the I clock signal is referred to as the reference clock signal. However, J, K, L or M clock signal may also be used as the reference clock signal. Although an exemplary embodiment of the present invention has been described above with a reference clock signal and four other clock signals, any other number of clock signals could be utilized as would be known to one of ordinary skill in the art.

The logic section 30 is coupled to the input section 10, and receives the phase signals 25 and one or more (for example, the M clock signal) of the clocks signals 35 to generate the first and fourth phase difference signals 45 and 55, and the first and second phase difference information signals 65 and 75 using the phase signals 25 and one or more (for example, the M clock signal) of the clocks signals 35.

The level control section 50 is coupled to the phase difference signal generating section 20, receives the first and second phase difference information signals 65 and 75 from the phase difference signal generating section 20, lowers a level of the first phase difference information signal 65 to generate a second phase difference signal 85 having a first level less than levels of the first and fourth phase difference signals 45 and 55, and lowers a level of the second phase difference information signal 75 to generate a third phase difference signal 95 having a second level less than the levels of the first and fourth phase difference signals 45 and 55.

Alternatively, the level control section 50 may vary the levels of the first and second phase difference information signal 65 and 75 to generate the second and third phase difference signal 85 and 95 in response to a control signal 105. The phase differences of the first and second phase difference informational signals 65 and 75 are smaller values, such as in a range from about 0° to about 45°. Therefore, the jitter measured in the clock and data recovery (CDR) circuit using the phase detector may be reduced when the levels of the first and second phase difference information signals 65 and 75 are lowered.

The control section 70 generates the control signal 105 for controlling the level control section 50. In particular, parameters (resistance or capacitance) of capacitive or resistive elements may be varied in response to the control signal 105, so that the level of the first and second phase difference information signal 65 and 75 may be varied.

Since the level control section 50 lowers the level of the phase difference signals having a small phase difference, the phase detector may operates in the same speed as that of the conventional phase detector and the jitter measured in a device, for example the clock and data recovery (CDR) circuit, using the phase detector may be reduced. In an exemplary embodiment, the voltage level of the first and second phase difference information signal 65 and 75 is lowered to obtain the second and third phase difference signal 85 and 95, however any other characteristic of the first and second phase difference information signal 65 and 75, such as a current or power level, could be lowered as would be known to one of ordinary skill in the art.

Figure 2:
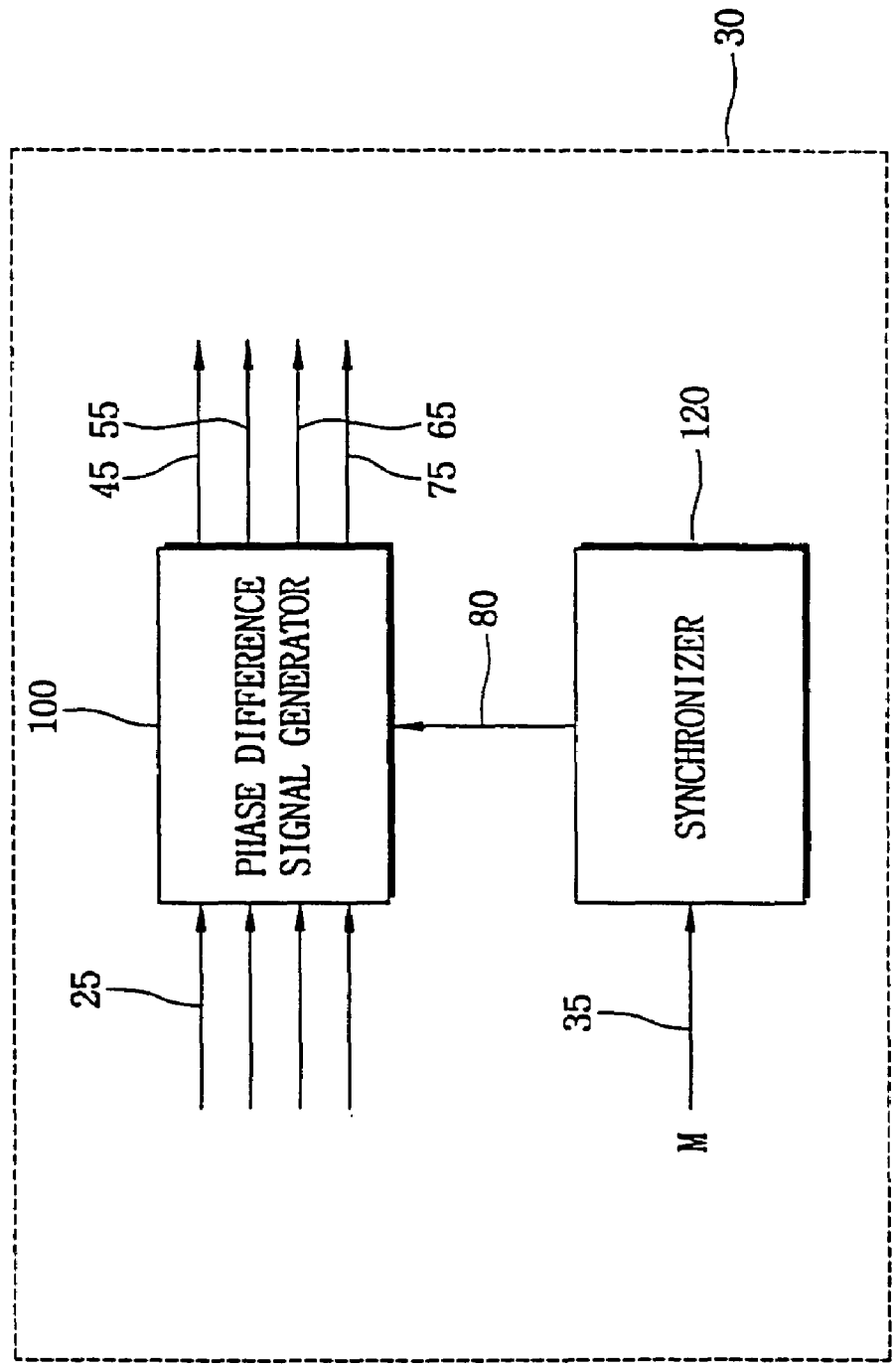
FIG. 2 is a logic section of FIG. 1 according to an exemplary embodiment of the present invention.

FIG. 2 illustrates a logic section 30 of FIG. 1 in an exemplary embodiment of the present invention. Referring to FIG. 2, the logic section 30 includes a phase difference signal generator 100 and a synchronizer 120.

The phase difference signal generator 100 detects the phase differences between the input data signal 15 and the reference clock signal to generate the first and fourth phase difference signals 45 and 55, and the first and second phase difference information signals 65 and 75 using the phase signals 25 and a synchronization signal 80.

The synchronizer 120 receives the M clock signal (for example) or whichever other clock signal 35 is chosen as the reference signal to generate the synchronization signal 80. The first and fourth phase difference signals 45 and 55, and the first and second phase difference information signals 65 and 75 are synchronized with the synchronization signal 80.

Figure 3:
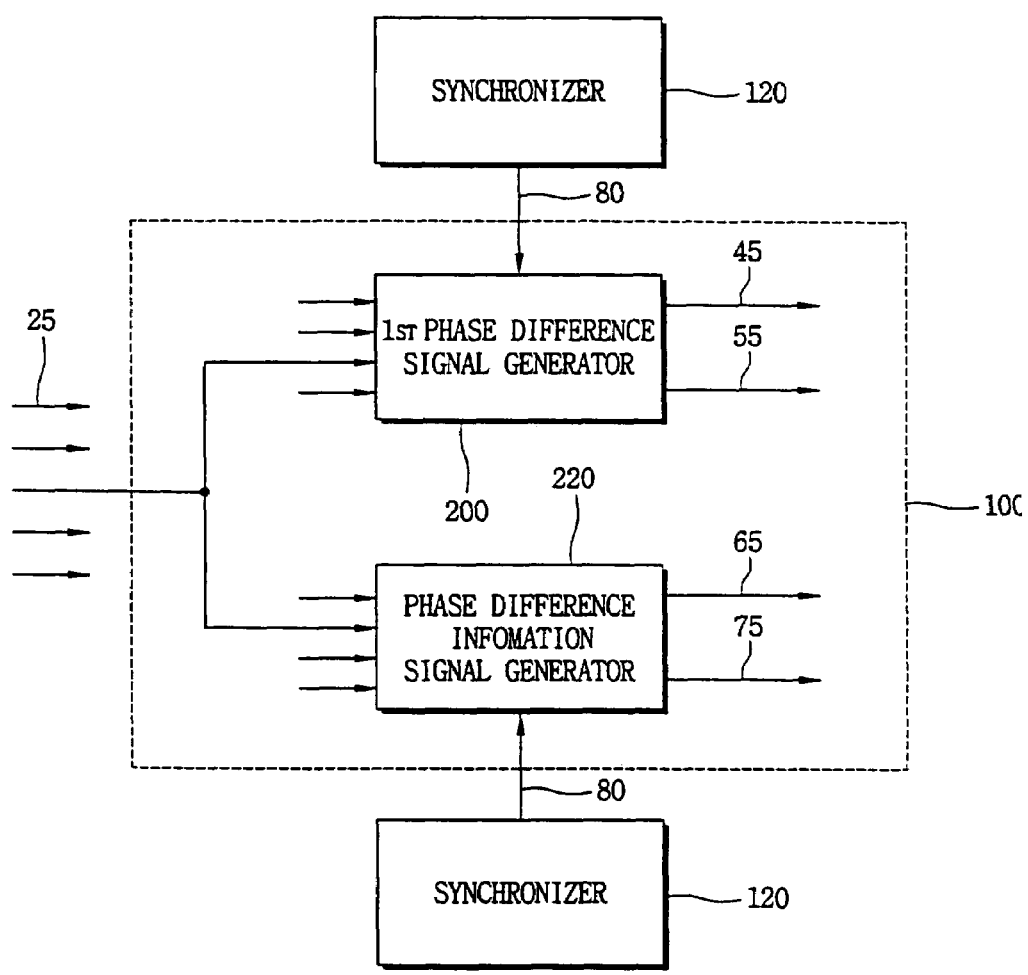
FIG. 3 is a phase difference signal generator of FIG. 2 according to an exemplary embodiment of the present invention.

FIG. 3 illustrates a phase difference signal generator 100 of FIG. 2 in an exemplary embodiment of the present invention. Referring to FIG. 3, the phase difference signal generator 100 includes a first phase difference signal generator 200 and a phase difference information signal generator 220.

The first phase difference signal generator 200 generates the first and fourth phase difference signals 45 and 55 using the phase signals 25 and the synchronization signal 80.

The phase difference information signal generator 220 generates the first and second phase difference information signals 65 and 75 using the phase signals 25 and the synchronization signal 80. In the exemplary embodiment of FIG. 3, the first phase difference signal generator 200 and the phase difference information signal generator 220 are shown as being synchronized with the same synchronizer 120. However, the first phase difference signal generator 200 and the phase difference information signal generator 220 could be synchronized with different synchronizers, as would be known to one of ordinary skill in the art.

Figure 4:
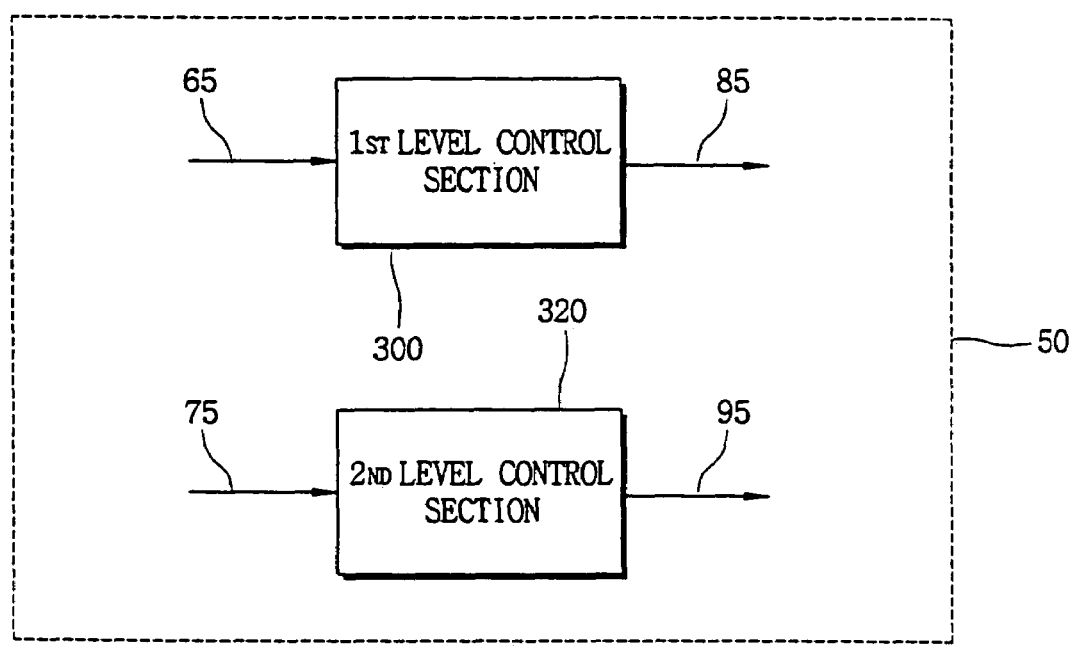
FIG. 4 is a level control section of FIG. 1 according to an exemplary embodiment of the present invention.

FIG. 4 illustrates a level control section 50 of FIG. 2, in an exemplary embodiment of the present invention. Referring to FIG. 4, the level control section 50 includes a first level control section 300 and a second level control section 320.

The first level control section 300 lowers the level of the first phase difference information signal 65 to generate the second phase difference signal 85 having the first level less than the levels of the first and fourth phase difference signals 45 and 55. Since the first level control section 300 only lowers the level of the first phase difference information signal 65, the second phase difference signal 85 has information about the second phase difference.

The second level control section 320 lowers the level of the second phase difference information signal 75 to generate the third phase difference signal 95 having the second level less than the levels of the first and fourth phase difference signals 45 and 55. Since the second level control section 320 only lowers the level of the second phase difference information signal 75, the third phase difference signal 85 has information about the third phase difference. In the exemplary embodiment of FIG. 4, the level control section 50 includes a first level control section 300 and a second level control section 320. However, the level control section 50 may include more or fewer level control sections, as would be known to one of ordinary skill in the art.

Figure 5:
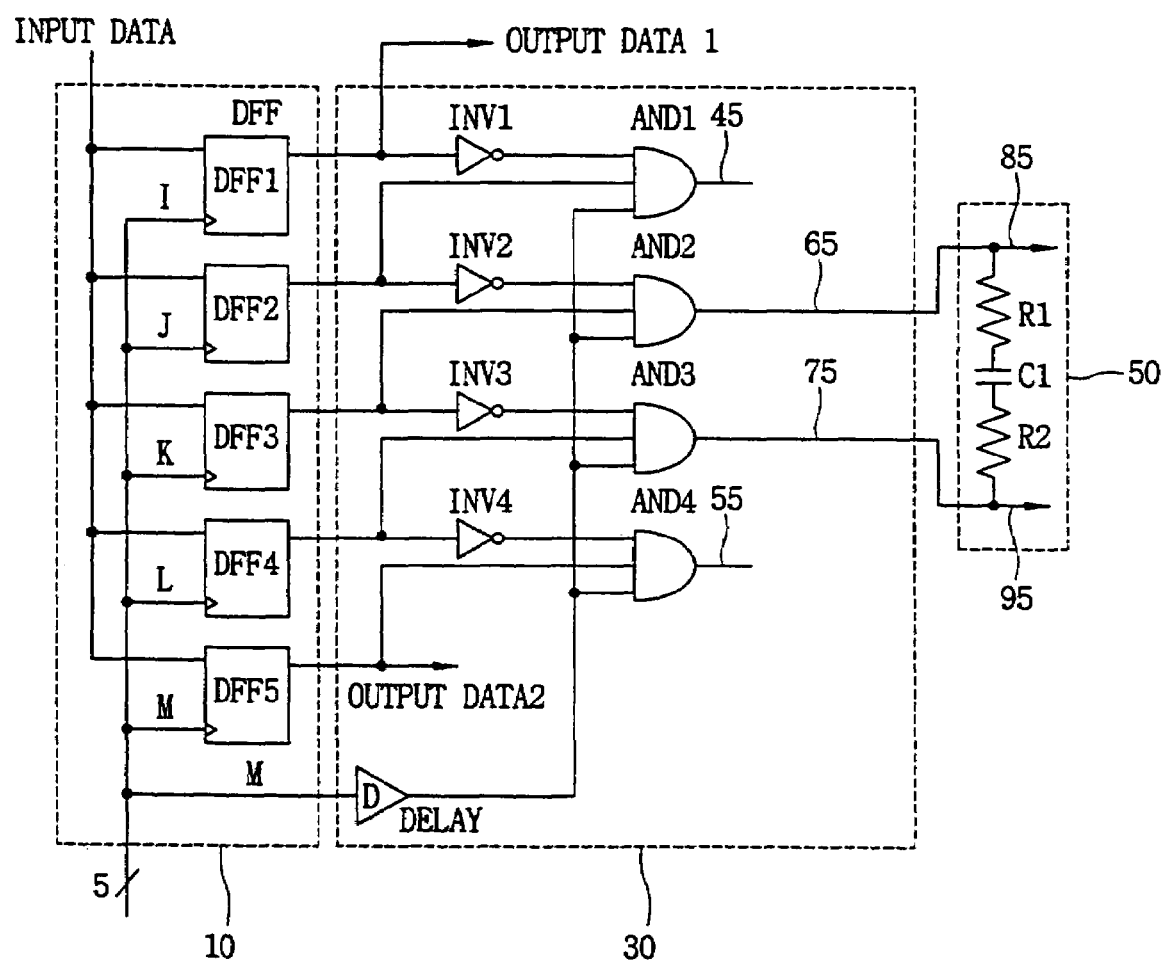
FIG. 5 is a circuit diagram showing an implementation of a phase detector according to an exemplary embodiment of the present invention.

FIG. 5 is a circuit diagram showing an implementation of a phase detector according to an exemplary embodiment of the present invention.

Referring to FIG. 5, an exemplary implementation of the input section 10 may include five D type flip flops (or D type FFs) DFF1, DFF2, DFF3, DFF4 and DFF5. A first D type FF (DFF1) receives the input data signal 15 in response to a front edge of the I clock signal, and latches the input data signal 15 until a next front edge of the I clock signal is inputted to the first D type FF (DFF1) to generate a first phase signal. A second D type FF (DFF2) receives the input data signal 15 in response to a front edge of the J clock signal, and latches the input data signal 15 until a next front edge of the J clock signal is inputted to the DFF2 to generate a second phase signal. A third D type FF (DFF3) receives the input data signal 15 in response to a front edge of the K clock signal, and latches the input data signal 15 until a next front edge of the K clock signal is inputted to the DFF3 to generate a third phase signal. A fourth D type FF (DFF4) receives the input data signal 15 in response to a front edge of the L clock signal, and latches the input data signal 15 until a next front edge of the L clock signal is inputted to the DFF4 to generate a fourth phase signal. A fifth D type FF (DFF5) receives the input data signal 15 in response to a front edge of the M clock signal, and latches the input data signal 15 until a next front edge of the M clock signal is inputted to the DFF53 to generate a fifth phase signal.

An exemplary implementation of the logic section 30 includes four inverters (INV1, INV2, INV3 and INV4), four AND gates (AND1, AND2, AND3 and AND4) and a delay device (D).

An exemplary implementation of the first phase difference signal generator 200 includes the first inverter INV1 coupled to the DFF1, the first AND gate AND1 coupled to the INV1, the fourth inverter INV4 coupled to the DFF4, and the fourth AND gate AND4 coupled to the INV4. The AND1 receives an output signal of the INV1, an output signal of the DFF2, and a delayed M clock signal delayed by the delay device (D). The AND4 receives an output signal of the INV4, an output signal of the DFF5, and the delayed M clock signal.

The phase difference information signal generator 220 includes the second inverter INV2 coupled to the DFF2, the second AND gate AND2 coupled to the INV2, the third inverter INV3 coupled to the DFF3, and the third AND gate AND3 coupled to the INV3. The AND2 receives an output signal of the INV2, an output signal of the DFF3, and the delayed M clock signal. The AND3 receives an output signal of the INV3, an output signal of the DFF4, and the delayed M clock signal.

The synchronizer 120 includes the delay device (D), and receives the M clock signal to output the delayed M clock signal.

In an exemplary embodiment, the level control section 50 may include an integrator. For example, the level control section 50 may include first and second resistors R1 and R2, and a capacitor C1. The resistances of the resistors R1 and R2 and the capacitance of the capacitor C1 may be variable such that improved or optimum jitter characteristic and/or pull-in time may be acquired. When the first and second phase difference information signals 65 and 75 having the smaller phase difference (about −45°~about +45°) are integrated by the level control section 50, the level of the voltage control signal inputted to a voltage controlled oscillator (VCO) of a CDR device (shown and described in more detail in conjunction with FIG. 9 below) may be lowered, so that the jitter may be reduced.

Figure 6A:
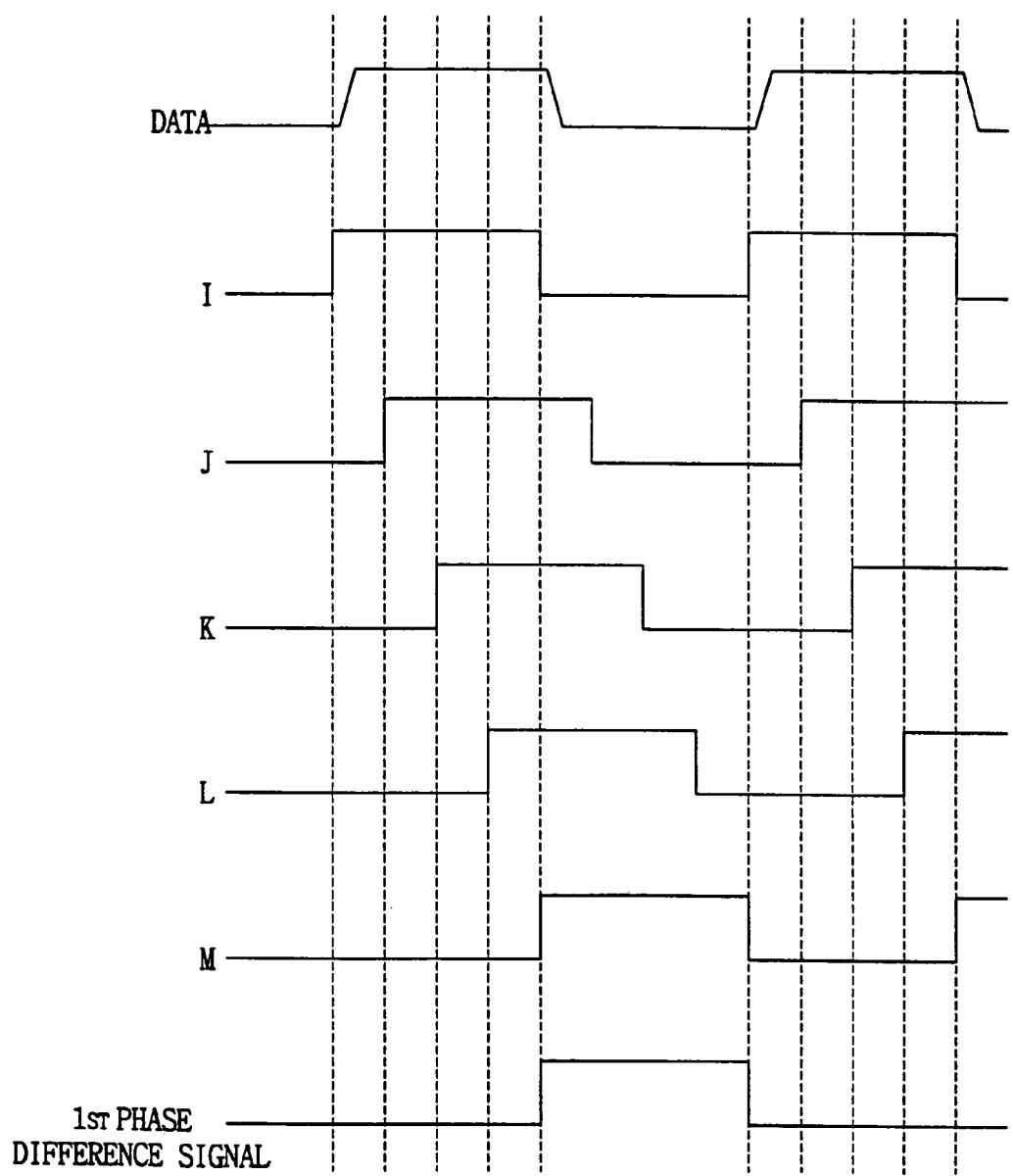
FIG. 6A is an exemplary timing diagram showing a first phase difference signal of FIG. 5.

FIG. 6A is an exemplary timing diagram showing a first phase difference signal 45 of FIG. 5. Referring to FIG. 6A, the clock signals 35 having a phase difference of n (where n is a natural number)×45° with respect to the reference clock signal are inputted to the input section 10. The input data signal 15 has a logic level of '0' at the instance of a rising edge of the I clock signal. Thus, the output signal of the DFF1 maintains '0' until next rising edge of the I clock signal is inputted to the DFF1. The output signal of INV1 has a logic level of '1'. The input data signal 15 has a logic level of '1' at the instance of rising edges of the J, K, L and M clock signals. Thus, the output signals of the DFF2, DFF3, DFF4 and DFF5 maintain '1' until next rising edges of the J, K, L and M clock signals are inputted to the DFF2, DFF3, DFF4 and DFF5, respectively, and the output signals of INV2, INV3, INV4 have a logic level of '0'. Therefore, the first phase difference signal 45 has a logic level of '1', and the fourth phase difference signal 55, the first and second phase difference information signals 65 and 75 have a logic level of '0'. Since the signals 45, 55, 65 and 75 are synchronized with the synchronization signal 80, only the first phase difference signal 45 is in an active status, and the phase detector detects the first phase difference as the first phase difference signal 45, as shown in FIG. 6A. The first phase difference is a phase difference between center of the input data signal 15 and the rising edge of the I clock signal. The first phase difference is larger, for example in a range from about 45° to about 90°.

Figure 6B:
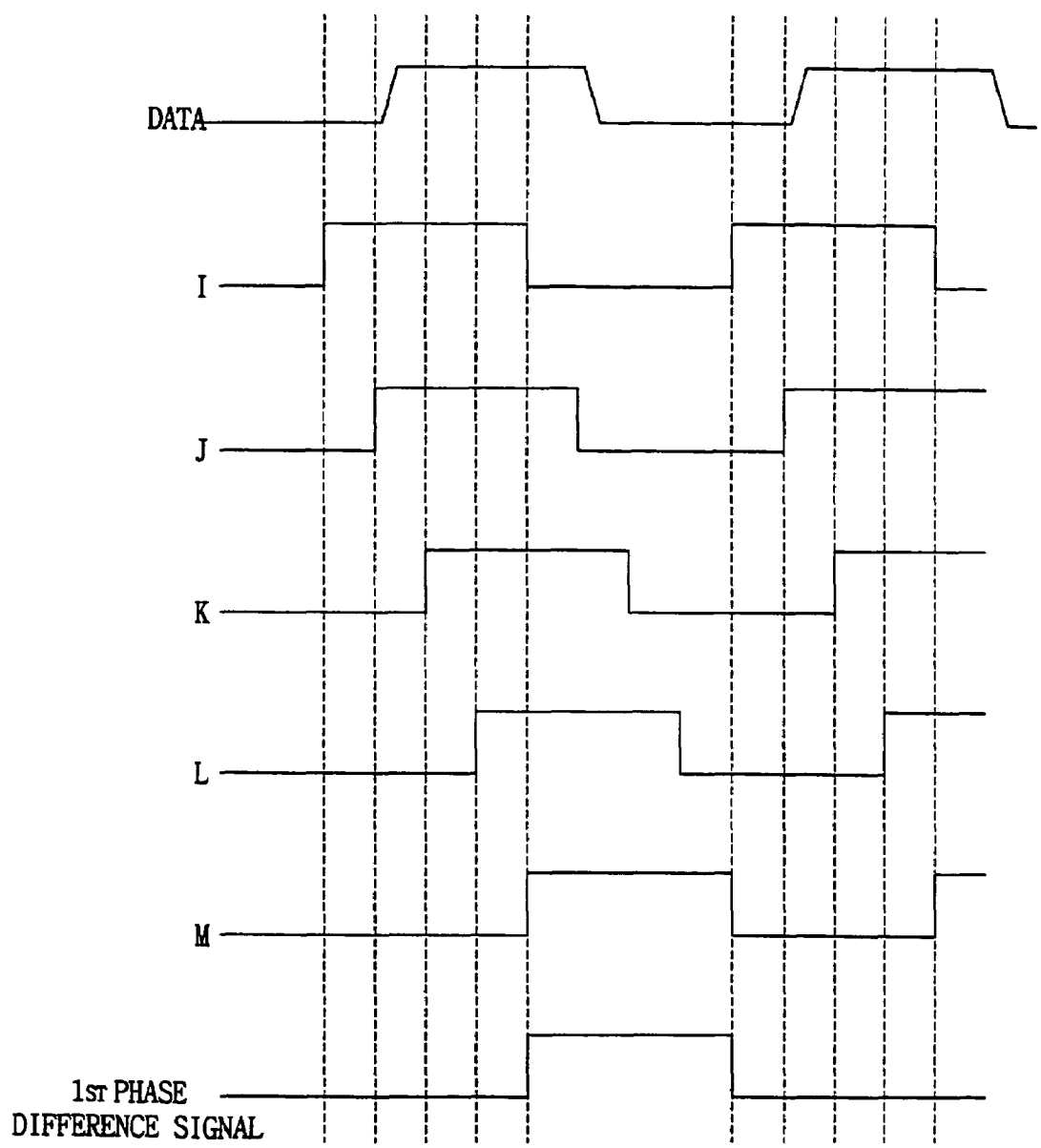
FIG. 6B is an exemplary timing diagram showing a first phase difference information signal of FIG. 5.

FIG. 6B is an exemplary timing diagram showing a first phase difference information signal 65 of FIG. 5. Referring to FIG. 6B, the clock signals 35 having a phase difference of n (where n is a natural number)×45° with respect to the reference clock signal are inputted to the input section 10. The input data signal 15 has a logic level of '0' at the instance of rising edges of the I and J clock signals. Thus, the output signals of the DFF1 and DFF2 maintain a logic level of '0' until next rising edges of the I and J clock signals are inputted to the DFF1, respectively, and the output signals of INV1 and INV2 have a logic level of '1'. The input data signal 15 has a logic level of '1' at the instance of rising edges of the K, L and M clock signals. Thus, the output signals of the DFF3, DFF4 and DFF5 maintain a logic level of '1' until next rising edges of the K, L and M clock signals are inputted to the DFF3, DFF4 and DFF5, respectively, and the output signals of INV3 and INV4 have a logic level of '0'. Therefore, the first phase difference information signal 65 has a logic level of '1', and the first and fourth phase difference signals 45 and 55 and the second phase difference information signals 75 have a logic level of '0'. Since the signals 45, 55, 65 and 75 are synchronized with the synchronization signal 80, only the first phase difference information signal 65 is in an active status, and the phase detector detects the second phase difference through the first phase difference information signal 65, as shown in FIG. 6B. The second phase difference is a phase difference between the center of the input data signal 15 and the rising edge of the I clock signal. The second phase difference is smaller, for example in a range from about 0° to about 45°.

The fourth phase difference signal 55 and the second phase difference information signal 75 may be produced by the phase difference signal generating section 20 in a similar manner as described above. As described above, the fourth phase difference of the fourth phase difference signal 55 is larger, for example, in a range from about 45° to about 90° and the third phase difference of the second phase difference information signal 75 is smaller, for example, in a range from about 0° to about 45°.

Figure 7A:
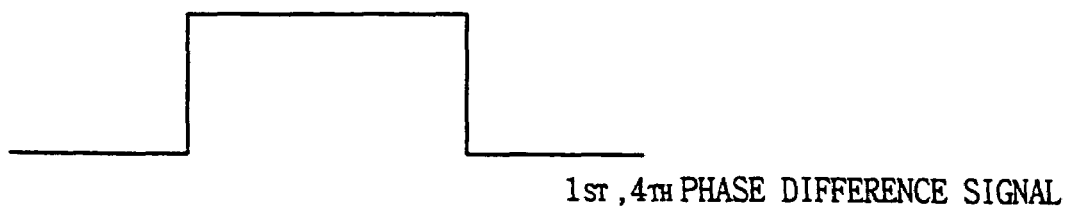
FIG. 7A is an exemplary graph showing the waveforms of the first and fourth phase difference signals of FIG. 5.
Figure 7B:
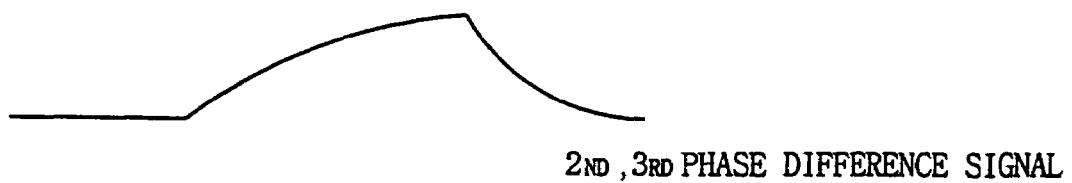
FIG. 7B is an exemplary graph showing the waveforms of the second and third phase difference signals of FIG. 5.

FIG. 7A is an exemplary graph showing the waveforms of the first and fourth phase difference signals 45, 55 of FIG. 5, and FIG. 7B is an exemplary graph showing the waveforms of the second and third phase difference signals 85, 95 of FIG. 5

As shown in FIGS. 7A and 7B, the waveforms of the first and fourth phase difference signals 45 and 55 are pulse shaped, and the waveforms of the second and third phase difference signals 85 and 95 is a shape that is acquired by integrating a pulse shaped signal. As shown in FIGS. 7A and &b, in an exemplary embodiment of the present invention, the level of the second and third phase difference signals 85 and 95 is lower than the levels of the first and fourth phase difference signals 45 and 55. The phase detector according to an exemplary embodiment of the present invention integrates the phase difference signals having a smaller phase difference, for example in a range from about 0° to about 45°, by means of the level control section 50, and thus the level of the phase difference signals having the smaller phase difference is lowered. When the level of the phase difference signals having the smaller phase difference is lowered, the jitter measured in a clock and data recovery (CDR) circuit using the phase detector may be reduced. Since the level control section 50 includes an integrator comprised of resistors and capacitor, the level of the phase difference signals having the smaller phase difference may be lowered by regulating the resistances of the resistors and the capacitance of the capacitor.

Figure 8:
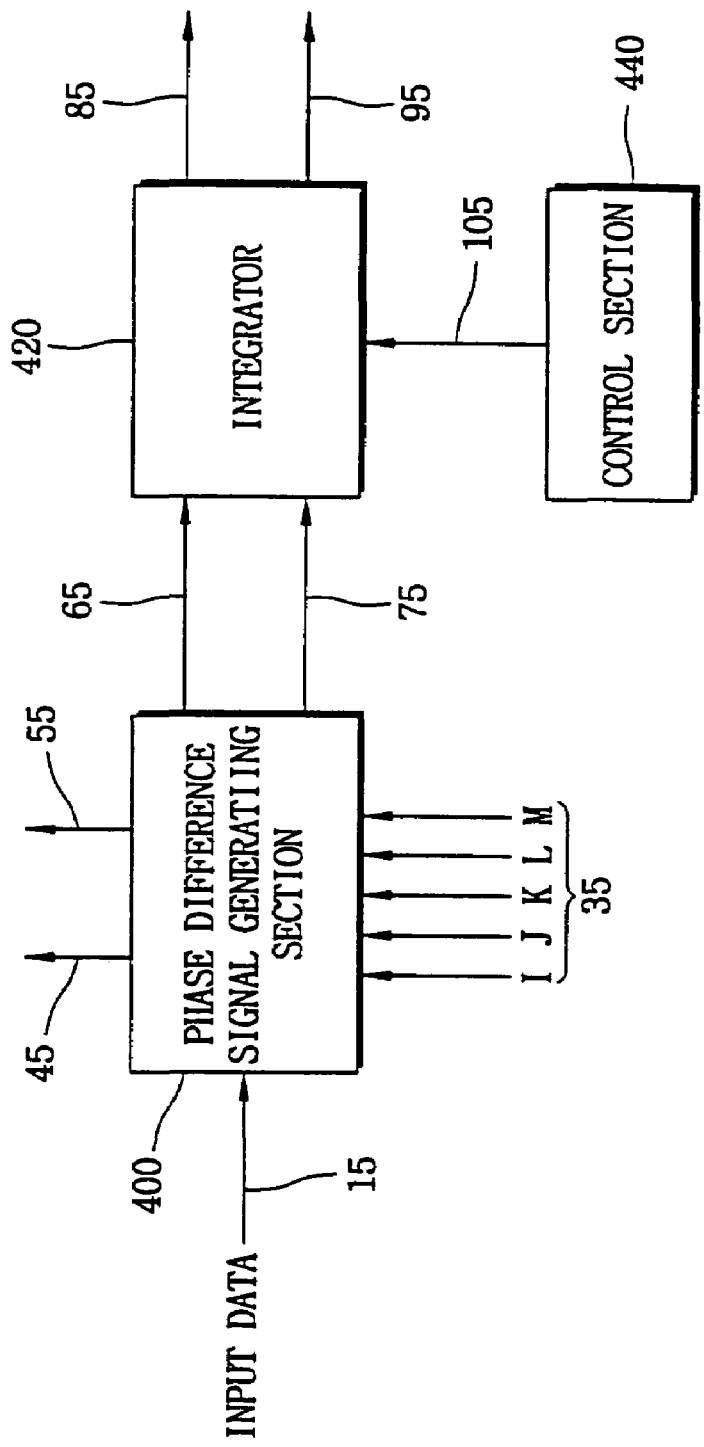
FIG. 8 is a block diagram showing a phase detector according to another exemplary embodiment of the present invention.

FIG. 8 is a block diagram showing a phase detector according to another exemplary embodiment of the present invention. Referring to FIG. 8, the phase detector according to another exemplary embodiment of the present invention includes a phase difference signal generating section 400, an integrator 420 and an optional control section 440.

The phase difference signal generating section 400 generates the first phase difference signal 45, the fourth phase difference signal 55, the first phase difference information signal 65 and the second phase difference information signal 75 using the input data signal 15 and the clock signals 35. The clock signals respectively have a phase difference of n (where n is a natural number)×45° with respect to the reference clock signal.

The integrator 420 generates the first and second phase difference signals 85 and 95 using the first and second phase difference information signals 65 and 75 and the control signal 105. In an exemplary embodiment, the integrator 420 integrates the first phase difference information signals 65 and generates the second phase difference signal 85 having a level lower than the levels of the first and fourth phase difference signals 45 and 55. In addition, the integrator 420 integrates the second phase difference information signals 75 and generates the third phase difference signal 95 having a level lower than the levels of the first and fourth phase difference signals 45 and 55. The control section 440 generates the control signal 105 for controlling the integrator 420.

FIG. 9 is a block diagram showing a clock and data recovery (CDR) device according to an exemplary embodiment of the present invention. Referring to FIG. 9, the CDR device includes a phase detector 500, a charge pump 520, a loop filter 540, a voltage controlled oscillator 560 and a determining circuit 580.

The phase detector 500 generates a first data signal 145, phase difference signals 45, 55, 85 and 95 using the input data signal 15 and the clock signals 35. The first and fourth phase difference signals 45 and 55 have a larger phase difference, for example in a range from about 45° to about 90°, and the second and third phase difference signals 85 and 95 have a smaller phase difference, for example in a range from about 0° to about 45°. The level of the second and third phase difference signals 85 and 95 is lowered by, for example, a level control section, such as the level control section 50 of FIG. 1 or an integrator, such as the integrator 420 of FIG. 8.

The charge pump 520 generates a charge control signal 115 for discharging and charging the charges of a filter 540 (in an exemplary embodiment, a loop filter) using the first, second, third and fourth phase difference signals 45, 55, 85 and 95.

The loop filter 540 is charged and discharged in response to the charge control signal 115 to generate a voltage control signal 125.

The voltage controlled oscillator 560 receives the voltage control signal 125 and compensates the frequencies of the clock signals 35 using the voltage control signal to output the compensated clock signals 135. The compensated clock signals 135 are provided to the phase detector 500, and thus the phase difference between the input data signal 15 and the compensated clock signals 135 may be detected by the phase detector 500.

The determining circuit 580 generates a re-timing second data signal 155 using the compensated clock signals and the first data signal 145.

When the phase detector according to exemplary embodiments of the present invention is used in the CDR device, the operating speed in which the clock recovery is performed may be maintained, and the jitter measured at the CDR device may be reduced.

Figure 10A:
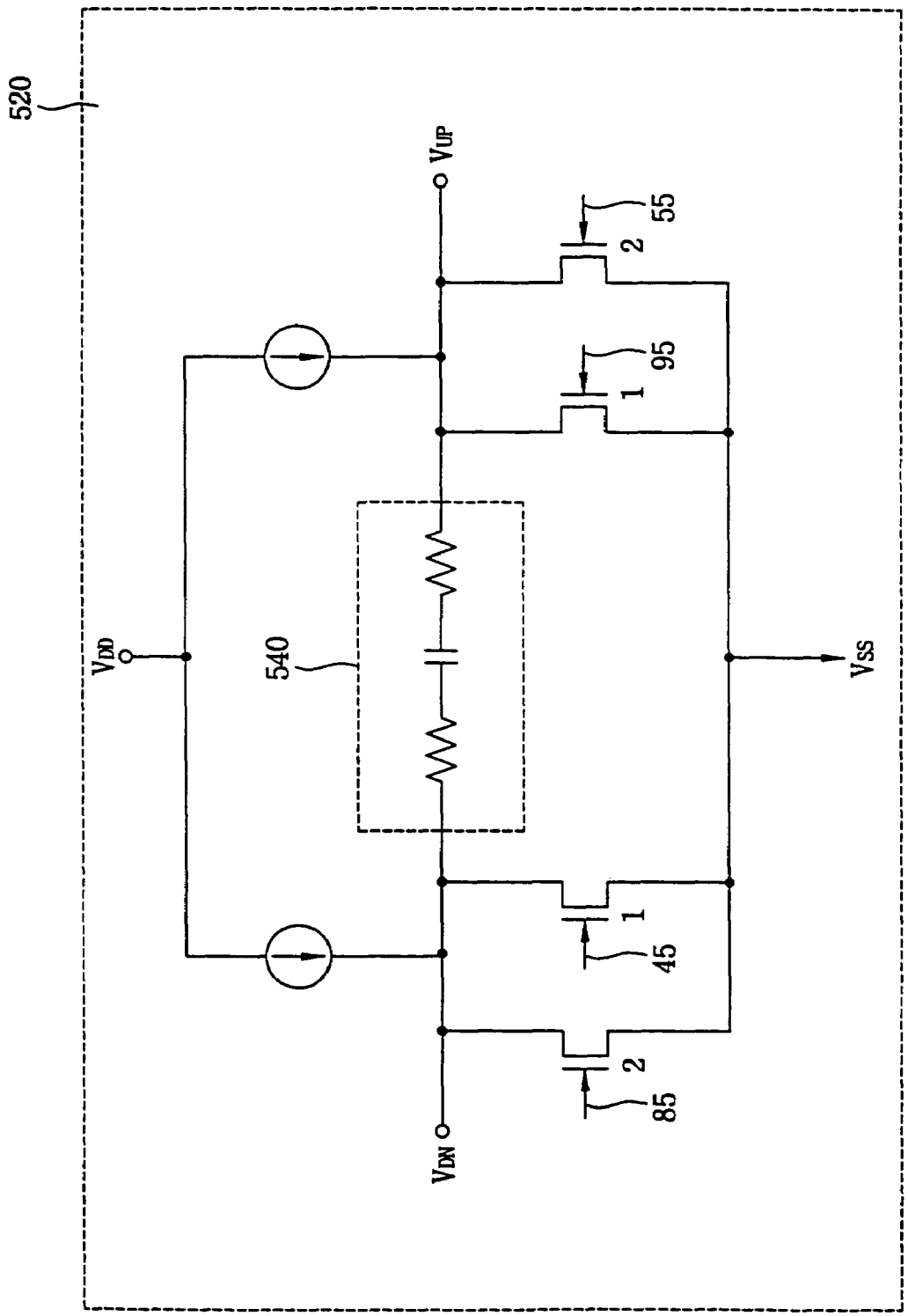
FIG. 10A is a charge pump circuit and a filter of FIG. 9 according to an exemplary embodiment of the present invention.
Figure 10B:
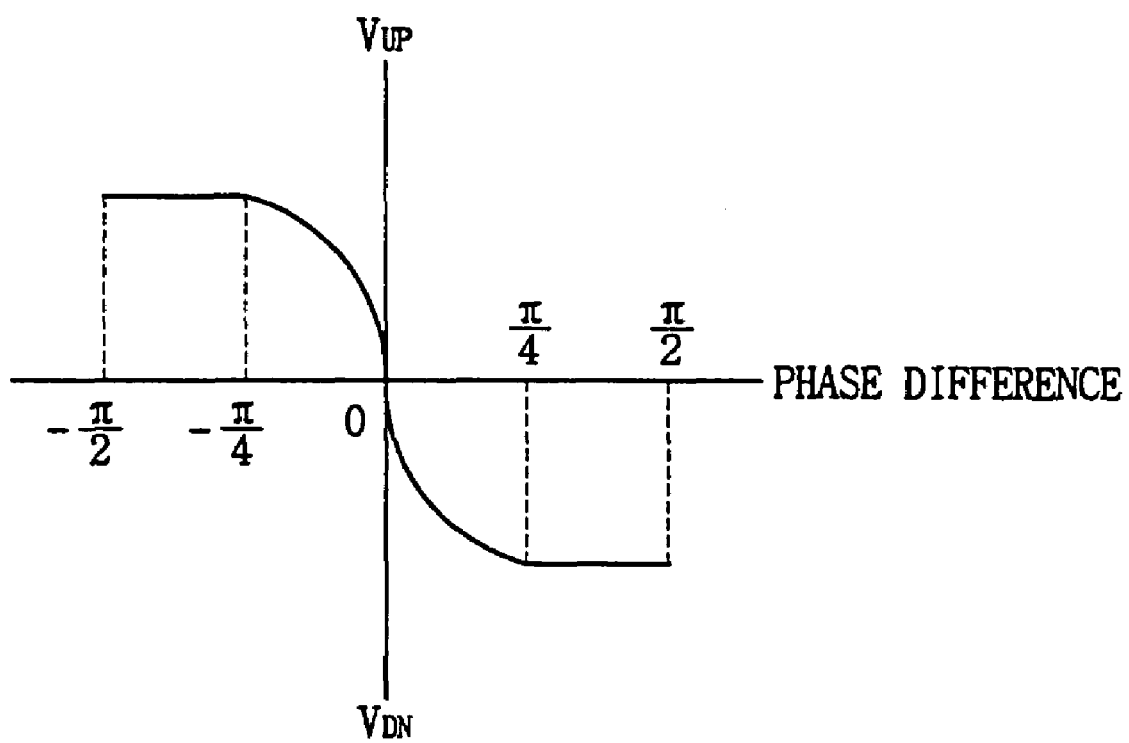
FIG. 10B is an exemplary graph showing an output voltage signal of the charge pump circuit and the filter of FIG. 9.

FIG. 10A is an exemplary embodiment of the charge pump circuit 520 and the filter 540 of FIG. 9, and FIG. 10B is an exemplary graph showing an output voltage signal of the charge pump circuit and the filter of FIG. 9.

Referring to FIGS. 10A and 10B, the first, second, third and fourth phase difference signals 45, 55, 85 and 95 are inputted to the charge pump 520. The transistor size of the NMOS transistors of the charge pump 520 may be different from each other. Thus, as shown in FIG. 10B, the level of the voltage control signal (Vup-Vdn) 125 varies depending upon the phase difference information, and the operational speed of the CDR device using the phase detector according to exemplary embodiments of the present invention may be enhanced when the CDR device recovers clock signals. The conventional bang-bang phase detector generates phase difference signals having a constant level without consideration of phase difference information. The conventional bang-bang phase detector outputs phase difference signals having the same (high) voltage level as that of the phase difference signal having a phase difference higher than 45° when the phase difference signal has a phase difference lower than 45°, and thus the conventional bang-bang phase detector requires more time to perform a tracking operation. Namely, the conventional bang-bang phase detector requires a larger pull-in time (or lock time) since the level of the voltage control signal corresponding to the phase difference signals having a smaller phase difference, for example lower than 45°, is the same as the level of the voltage control signal corresponding to the phase difference signal having a larger phase difference, for example higher than 45°. However, when the level of the phase difference signals varies depending upon the phase difference, the level of the voltage control signal outputted from the charge pump 520 and loop filter 540 varies. Consequently, the VCO of the CDR device using phase detectors according to exemplary embodiments of the present invention compensates for the frequency of clock signal when the phase difference signal has a smaller phase difference, thus the pull-in time and the jitter may be reduced under the influence of a lower level voltage control signal corresponding to a phase difference signal having a smaller phase difference than would be characteristic of a VCO used in conjunction with the phase detector according to exemplary embodiments of the present invention. The pull-in time may be defined as a time period required to perform a locking operation.

Figure 11A:
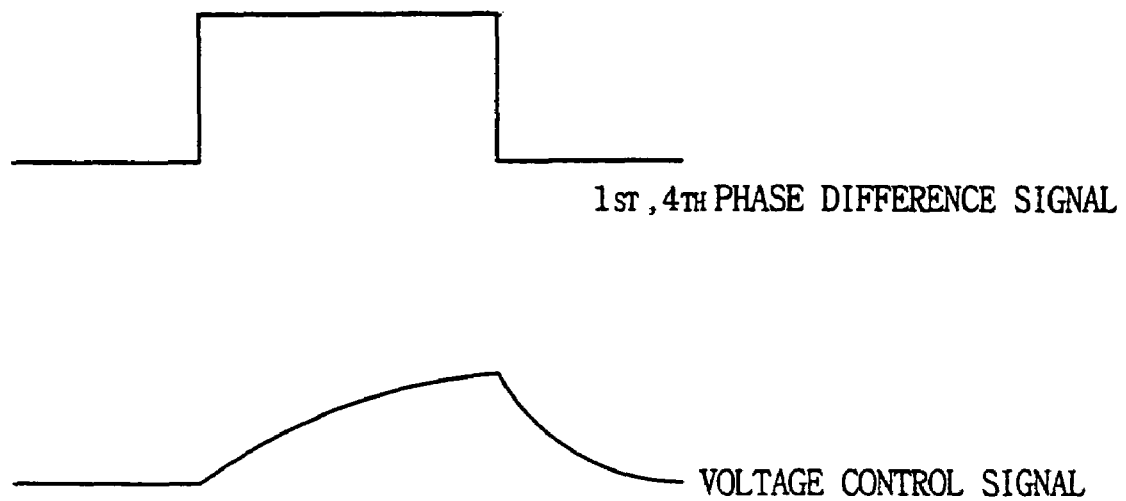
FIG. 11A is an exemplary timing diagram showing a voltage control signal of a conventional CDR device.
Figure 11B:
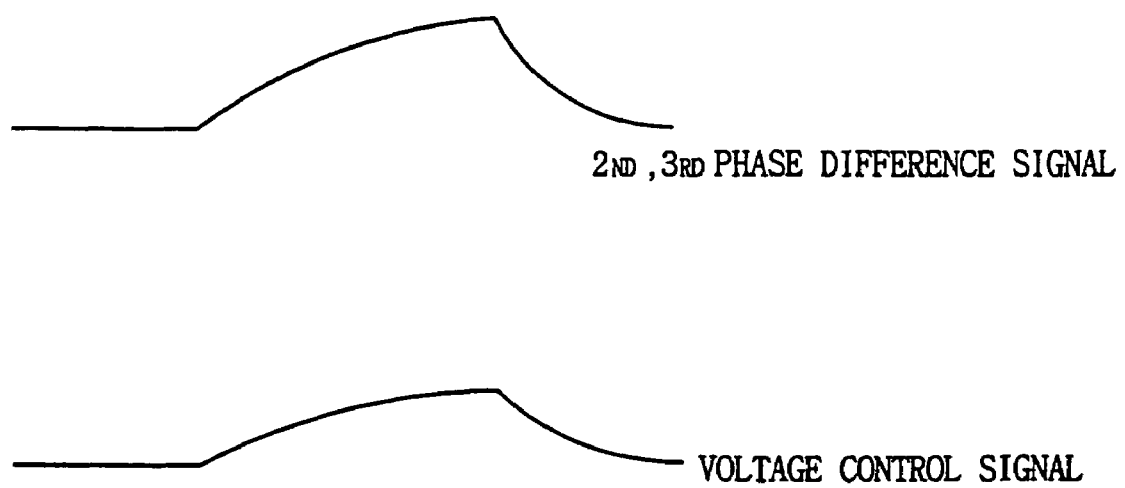
FIG. 11B is an exemplary timing diagram showing a voltage control signal of a CDR device according to an exemplary embodiment of the present invention.

FIG. 11A is an exemplary timing diagram showing a voltage control signal of a conventional CDR device, and FIG. 11B is an exemplary timing diagram showing a voltage control signal of a CDR device according to an exemplary embodiment of the present invention.

Referring to FIGS. 11A and 11B, the level of the voltage control signal 125 generated by the phase detector according to exemplary embodiments of the present invention is lower than the level of the voltage control signal according to the conventional phase detector. Thus, the pull-in time and/or the jitter may be reduced in a CDR device using a phase detector according to exemplary embodiments of the present invention. In particular, in the CDR device using the phase detector according to exemplary embodiments of the present invention, the operational speed of the CDR device may be the same as that of the conventional CDR device and jitter may be reduced compared with the conventional CDR device when the phase difference signal outputted from the phase detector has a smaller phase difference. In addition, the operational speed of the CDR device using the phase detector according to exemplary embodiments of the present invention may be enhanced and jitter characteristics may not be deteriorated compared with the conventional CDR device when the phase difference signal outputted from the phase detector of the present invention has a larger phase difference, since the level of the voltage control signal of the CDR device using the phase detector according to exemplary embodiments of the present invention is the same as the level of the voltage control signal of the CDR device using the conventional phase detector when the phase difference signal has a larger phase difference.

Figure 12:
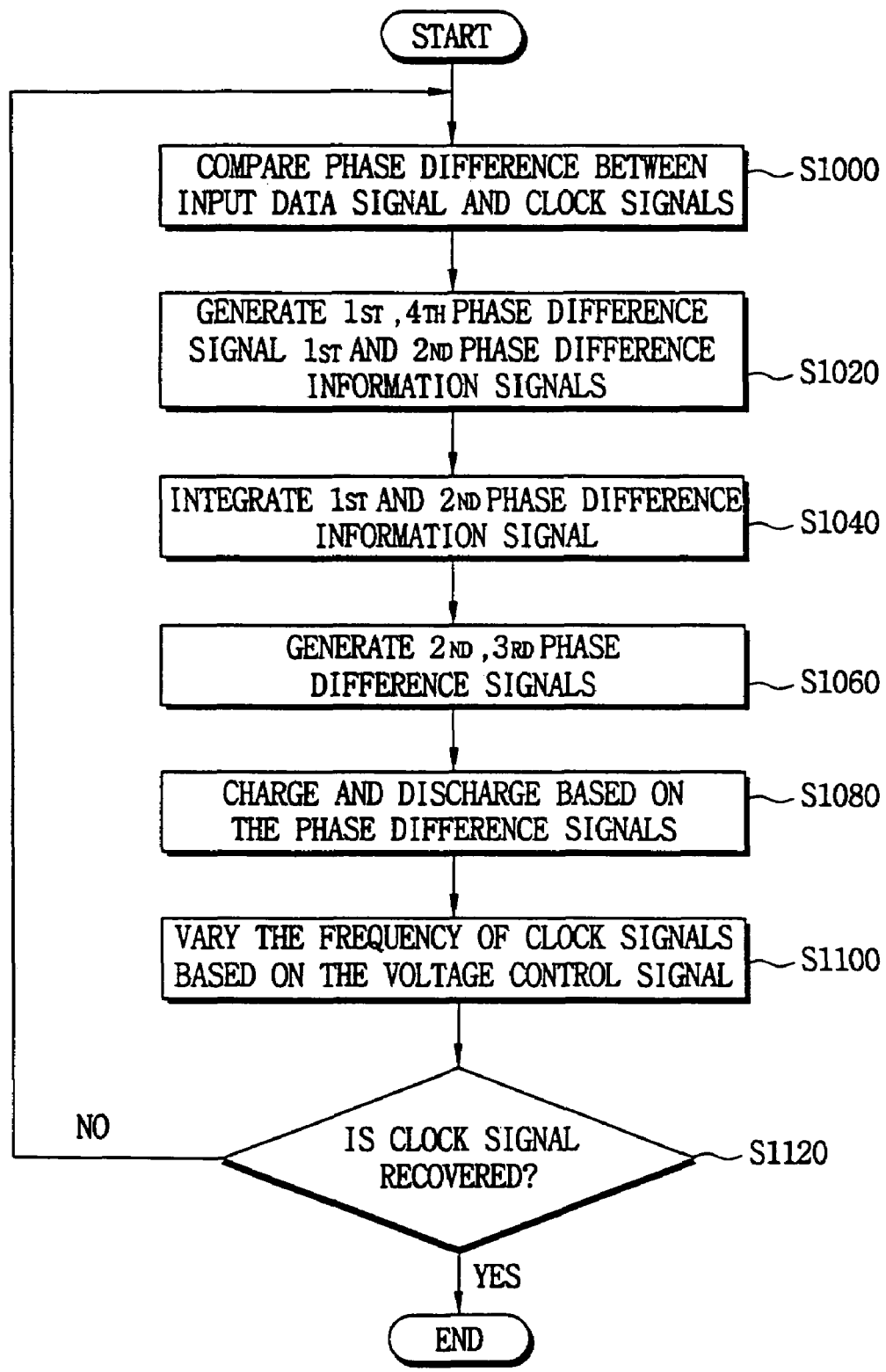
FIG. 12 is a flow chart showing a method of recovering clock and data according to one exemplary embodiment of the present invention.

FIG. 12 is a flow chart showing a method of recovering clock and data according to one exemplary embodiment of the present invention.

Referring to FIG. 12, the phase of the input data signal is compared with the phase of the clock signals 35 (step S1000). Thus, the first phase difference signal 45, the fourth phase difference signal 55, the first phase difference information signal 65 and the second phase difference information signal 75 are generated (step S1020). Then, the first and second phase difference information signals 65 and 75 are integrated (step S1040), and the second and third phase difference signals 85 and 95 respectively corresponding to the result of the integration of the first and second phase difference information signals 65 and 75 are generated (step S1060). The quantity of the charges are controlled based on the phase difference signals 45, 55, 85 and 95, and the voltage control signal 125 corresponding to the quantity of the charges is generated (step S1080). The frequency of the clock signals 35 is varied based on the voltage control signal 125 (step S1100). Then, a determination is made whether the clock signal has been recovered (step S1120). When the clock signal has not been recovered, control is returned to step S1000 and the process is repeated. When the clock signal has been recovered, the operation of recovering the clock signal is finished.

In the exemplary embodiment of the present invention described above, although 45° has been used as the general cut-off between a smaller phase difference and a larger phase difference, this value could be varied up or down as would be known to one of ordinary skill in the art.

While the exemplary embodiments of the present invention and its advantages have been described in detail, it should be understood that various changes, substitutions and alterations can be made herein without departing from the scope of the invention as defined by appended claims.

What is claimed is:

1. A method of detecting a phase difference, the method comprising:
    generating first and fourth phase difference signals having a first phase difference and a fourth phase difference, respectively, and first and second phase difference information signals having a second phase difference and a third phase difference, respectively, from an input signal and a plurality of clock signals, each of which has a different phase;
    lowering a level of the first phase difference information signal to generate a second phase difference signal having a first level less than levels of the first and fourth phase difference signals;
    lowering a level of the second phase difference information signal to generate a third phase difference signal having a second level less than the levels of the first and fourth phase difference signals; and
    generating a synchronization signal with which the first phase difference signal, the fourth phase difference signal, the first phase difference information signal, and the second phase difference information signal are synchronized.

2. The method of claim 1, further comprising generating a control signal and lowering the levels of the first and second phase difference information signals in accordance with the control signal.

3. The method of claim 1, wherein the clock signals include a reference clock signal that is a reference signal for determining the first, second, third and fourth phase differences.

4. The method of claim 3, wherein the clocks signals includes:
    a first clock signal that is the same as the reference clock signal;
    a second clock signal having a fifth phase difference of about 45° with respect to the first clock signal;
    a third clock signal having a sixth phase difference of about 90° with respect to the first clock signal;
    a fourth clock signal having a seventh phase difference of about 135° with respect to the first clock signal; and
    a fifth clock signal having an eighth phase difference of about 180° with respect to the first clock signal.

5. The method of claim 4, wherein the first, second, third and fourth phase differences are phase differences between a center of the input signal and rising edge of the reference clock signal.

6. The method of claim 5, wherein the first and fourth phase differences are in a range from about 45° to about 90° and the second and third phase differences are in a range from about 0° to about 45°.

7. The method of claim 1, wherein the generating the first phase difference signal includes:
    generating a first input information signal;
    buffering the first input information signal; and
    generating the first phase difference signal from the buffered first input information signal.

8. The method of claim 1, wherein the generating the fourth phase difference signal includes:
    generating a fourth input information signal;
    buffering the fourth input information signal; and generating the fourth phase difference signal from the buffered fourth input information signal.

9. The method of claim 1, wherein the generating the first phase difference information signal includes:
generating a second input information signal;
buffering the second input information signal; and
generating the first phase difference information signal from the buffered second input information signal.

10. The method of claim 1, wherein the generating the second phase difference information signal includes:
generating a third input information signal;
buffering the third input information signal; and
generating the second phase difference information signal from the buffered third input information signal.

11. A phase detector performing the method of claim 1.

12. A method of detecting a phase difference, the method comprising:
generating first and fourth phase difference signals having a first phase difference and a fourth phase difference, respectively, and first and second phase difference information signals having a second phase difference and a third phase difference, respectively, using an input signal and a plurality of clock signals, each of which has a phase difference of n×45° with respect to a reference clock signal (where n is a natural number);
integrating the first phase difference information signal to generate a second phase difference signal having a first level less than levels of the first and fourth phase difference signals;
integrating the second phase difference information signal to generate a third phase difference signal having a second level less than the levels of the first and fourth phase difference signals; and
integrating a synchronization signal with which the first phase difference signal, the fourth phase difference sianal, the first phase difference information signal, and the second phase difference information signal are synchronized.

13. The method of claim 12, wherein the first, second, third and fourth phase differences are phase differences between a center of the input signal and rising edge of the reference clock signal.

14. A phase detector comprising:
a phase difference signal generating section configured to generate a first phase difference signal having a first phase difference, a fourth phase difference signal having a fourth phase difference, a first phase difference information signal having a second phase difference, and a second phase difference information signal having a third phase difference using an input signal and a plurality of clock signals each of which has different phase, and further including a synchronizer configured to generate the synchronization signal using one of the clock signals, the first and fourth phase difference signals, and the first and second phase difference information signals being synchronized with the synchronization signal; and
a level control section, coupled to the phase difference signal generating section, configured to receive the first and second phase difference information signals from the phase difference signal generating section, configured to lower a level of the first phase difference information signal to generate a second phase difference signal having a first level less than levels of the first and fourth phase difference signals, and configured to lower a level of the second phase difference information signal to generate a third phase difference signal having a second level less than the levels of the first and fourth phase difference signals.

15. The phase detector of claim 14, wherein the phase difference signal generating section includes:
an input section configured to receive the input signal and the clock signals to generate a plurality of phase signals from the input signal and the clock signals; and
a logic section, coupled to the input section, configured to receive the phase signals and at least one of the clocks signals to generate the first and fourth phase difference signals, and the first and second phase difference information signals.

16. The phase detector of claim 14, wherein the clock signals include a reference clock signal that is a reference signal configured to determine the first, second, third and fourth phase differences.

17. The phase detector of claim 14, wherein the clocks signals include:
a first clock signal that is the same as the reference clock signal;
a second clock signal having a fifth phase difference of about 45° with respect to the first clock signal;
a third clock signal having a sixth phase difference of about 90° with respect to the first clock signal;
a fourth clock signal having a seventh phase difference of about 135° with respect to the first clock signal; and
a fifth clock signal having an eighth phase difference of about 180° with respect to the first clock signal.

18. The phase detector of claim 17, wherein the first, second, third and fourth phase differences are phase differences between a center of the input signal and rising edge of the reference clock signal.

19. The phase detector of claim 18, wherein the first and fourth phase differences respectively are in a range from about 45° to about 90°, and the second and third phase differences respectively are in a range from about 0° to about 45°.

20. The phase detector of claim 15, wherein the input section includes a plurality of D type flip flops.

21. The phase detector of claim 20, wherein the D type flip flops are coupled with each other in parallel.

22. The phase detector of claim 15, wherein the input section includes:
a first D type flip flop configured to receive the input signal to generate a first phase signal in response to the first clock signal;
a second D type flip flop configured to receive the input signal to generate a second phase signal in response to the second clock signal;
a third D type flip flop configured to receive the input signal to generate a third phase signal in response to the third clock signal;
a fourth D type flip flop configured to receive the input signal to generate a fourth phase signal in response to the fourth clock signal; and
a fifth D type flip flop configured to receive the input signal to generate a fifth phase signal in response to the fifth clock signal.

23. The phase detector of claim 15, wherein the logic section includes:
a phase difference signal generator configured to receive the phase signals and a synchronization signal to generate the first and fourth phase difference signals, and the first and second phase difference information signals using the phase signals and the synchronization signal and wherein the logic section includes the synchronizer.

24. The phase detector of claim 23, wherein the phase difference signal generator includes:
- a first phase difference signal generator configured to generate the first and fourth phase difference signals using the phase signals and the synchronization signal; and
- a phase difference information signal generator configured to generate the first and second phase difference information signals using the phase signals and the synchronization signal.

25. The phase detector of claim 24, wherein the first phase difference signal generator includes:
- a first inverter coupled to a first D type flip flop;
- a fourth inverter coupled to a fourth D type flip flop;
- a first AND gate coupled to the first inverter; and
- a fourth AND gate coupled to the fourth inverter.

26. The phase detector of claim 24, wherein the phase difference information signal generator includes:
- a second inverter coupled to a second D type flip flop;
- a third inverter coupled to a third D type flip flop;
- a second AND gate coupled to the second inverter; and
- a third AND gate coupled to the third inverter.

27. The phase detector of claim 23, wherein the synchronizer includes a delay device.

28. The phase detector of claim 14, wherein the level control section includes:
- a first level control section configured to lower the level of the first phase difference information signal to generate the second phase difference signal having the first level less than the levels of the first and fourth phase difference signals; and
- a second level control section configured to lower the level of the second phase difference information signal to generate the third phase difference signal having the second level less than the levels of the first and fourth phase difference signals.

29. The phase detector of claim 28, wherein the first level control section includes an integrator configured to integrate the first phase difference information signal.

30. The phase detector of claim 29, wherein the first level control section includes:
- a first resistive element coupled to a second AND gate; and
- a first capacitive element coupled to the first resistive element.

31. The phase detector of claim 28, wherein the second level control section includes an integrator configured to integrate the second phase difference information signal.

32. The phase detector of claim 31, wherein the second level control section includes:
- a second resistive element coupled to a third AND gate; and
- a second capacitive element coupled to the second resistive element.

33. The phase detector of claim 14, further comprising a control section configured to generate a control signal for controlling the levels of the first and second phase difference information signals.

34. A phase detector comprising:
- a phase difference signal generating section configured to generate a first phase difference signal having a first phase difference, a fourth phase difference signal having a fourth phase difference, a first phase difference information signal having a second phase difference, and a second phase difference information signal having a third phase difference from an input signal and a plurality of clock signals, each of which has a phase difference of n×45° with respect to a reference clock signal (where n is a natural number). and configured to synchronize the first and fourth phase difference signals and the first and second phase difference information signals with one of the clock signals; and
- an integrator, coupled to the phase difference signal generating section, configured to receive the first and second phase difference information signals from the phase difference signal generating section, configured to generate a second phase difference signal having a first level less than levels of the first and fourth phase difference signals, and configured to generate a third phase difference signal having a second level less than the levels of the first and fourth phase difference signals.

35. The phase detector of claim 34, wherein the integrator includes:
- a first resistive element coupled to the phase difference signal generating section;
- a capacitive element coupled to the first resistive element; and
- a second resistive element coupled to the phase difference signal generating section and the capacitive element.

36. The phase detector of claim 34, wherein the clock signals include a reference clock signal that is a reference signal configured to determine the first, second, third and fourth phase differences.

37. The phase detector of claim 36, wherein the clocks signals includes:
- a first clock signal that is the same as the reference clock signal;
- a second clock signal having a fifth phase difference of about 45° with respect to the first clock signal;
- a third clock signal having a sixth phase difference of about 90° with respect to the first clock signal;
- a fourth clock signal having a seventh phase difference of about 135° with respect to the first clock signal; and
- a fifth clock signal having an eighth phase difference of about 180° with respect to the first clock signal.

38. The phase detector of claim 37, wherein the first, second, third and fourth phase differences are phase differences between a center of the input signal and rising edge of the reference clock signal.

39. The phase detector of claim 38, wherein the first and fourth phase differences are in a range from about 45° to about 90°, and the second and third phase differences are in a range from about 0° to about 45°.

40. The phase detector of claim 34, further comprising a control section configured to generate a control signal for controlling the control the integrator to control the levels of the first and second phase difference information signals.

41. A method of detecting a phase difference, the method comprising:
- generating a plurality of phase difference signals having a corresponding plurality of phase differences from an input signal and a plurality of clock signals, each of which has a different phase; and
- lowering a level of one or more of the plurality of phase difference signals depending on a value of the corresponding phase difference.

42. The method of claim 41, wherein the level of one or more of the plurality of phase difference signals is lowered when the corresponding phase difference is below a given threshold.

43. The method of claim 41, wherein the lowering includes proportionally varying the level of one or more of the plurality of phase difference signals depending on the value of the corresponding phase difference.

44. A phase detector comprising:
a phase difference signal generating section configured to generate a plurality of phase difference signals having a corresponding plurality of phase differences from an input signal and a plurality of clock signals, each of which has a different phase; and
a level control section configured to lower a level of one or more of the plurality of phase difference signals depending on a value of the corresponding phase difference.

45. The phase detector of claim 44, wherein the level control section lowers the level of one or more of the plurality of phase difference signals when the corresponding phase difference is below a given threshold.

46. The phase detector of claim 44, wherein the level control section is configured to proportionally vary the level of one or more of the plurality of phase difference signals depending on the value of the corresponding phase difference.

47. A level control section of a phase detector comprising:
a plurality of level control sections, each receiving a phase difference signal of a plurality of phase difference signals, the plurality of phase difference signals each having a corresponding phase differences, the plurality of phase difference signals being generated from an input signal and a plurality of clock signals, each of which has a different phase; and
each of the plurality of level control sections lowering a level of the corresponding phase difference signal depending on a value of the corresponding phase difference.

48. The level control section of claim 47, wherein each of the plurality of level control sections lowers the corresponding phase difference signal when the corresponding phase difference is below a given threshold.

49. The level control section of claim 47, wherein each of the plurality of level control sections proportionally varies the level of the corresponding phase difference signal depending on the value of the corresponding phase difference.

50. A phase detector including the level control section of claim 47.

51. A clock and data recovering device including the phase detector of claim 50.

* * * * *